(12) United States Patent
Bahnmueller et al.

(10) Patent No.: US 11,243,237 B2
(45) Date of Patent: Feb. 8, 2022

(54) METHOD FOR DETERMINING AN ELECTRICAL PARAMETER AND MEASUREMENT ARRANGEMENT FOR DETERMINING AN ELECTRICAL PARAMETER

(71) Applicant: Sciosense B.V., AE Eindhoven (NL)

(72) Inventors: Friedrich Bahnmueller, Karlsruhe (DE); Ulf-Thore Glindemann, Russheim (DE)

(73) Assignee: SCIOSENSE B.V., AE Eindhoven (NL)

( * ) Notice: Subject to any disclaimer, the term of this patent is extended or adjusted under 35 U.S.C. 154(b) by 103 days.

(21) Appl. No.: 16/634,477

(22) PCT Filed: Jul. 5, 2018

(86) PCT No.: PCT/EP2018/068258
§ 371 (c)(1),
(2) Date: Jan. 27, 2020

(87) PCT Pub. No.: WO2019/025116
PCT Pub. Date: Feb. 7, 2019

(65) Prior Publication Data
US 2020/0158767 A1     May 21, 2020

(30) Foreign Application Priority Data
Jul. 31, 2017   (EP) ..................... 17184021

(51) Int. Cl.
*G01R 27/26*  (2006.01)
*G01R 27/02*  (2006.01)

(52) U.S. Cl.
CPC ......... *G01R 27/2605* (2013.01); *G01R 27/02* (2013.01)

(58) Field of Classification Search
CPC ........ G01R 27/00; G01R 27/02; G01R 27/26; G01R 27/2605; G06F 3/044; G01D 5/00;
(Continued)

(56) References Cited

U.S. PATENT DOCUMENTS 3,824,459 A    7/1974  Uchida
3,913,129 A *  10/1975 Snyder ................... G01R 13/04
                                                           360/6

(Continued)

FOREIGN PATENT DOCUMENTS

CN    102193032 A    9/2011
CN    105527501 A    4/2016
(Continued)

OTHER PUBLICATIONS

European Patent Office, International Search Report for PCT/EP2018/068258 dated Oct. 8, 2018.

*Primary Examiner* — Hoai-An D. Nguyen
(74) *Attorney, Agent, or Firm* — Slater Matsil, LLP

(57) ABSTRACT

In an embodiment a method for determining an electrical parameter includes charging, in parallel, a first capacitor and a second capacitor from a common supply voltage, measuring a first discharge time by discharging the first capacitor using a comparator and a time-to-digital converter that is connected to an output of the comparator and that provides a digital output signal, measuring a second discharge time by discharging the first capacitor a second time or by discharging the second capacitor using the comparator and the time-to-digital converter and determining the electrical parameter from a ratio of the first and second discharge times.

20 Claims, 2 Drawing Sheets

(58) Field of Classification Search
CPC .. G01D 5/12; G01D 5/14; G01D 5/24; G01D 5/2403; G01D 5/2405; G01D 5/241; G01D 5/2412; G01D 5/2417
USPC ....... 324/600, 649, 658, 661, 676, 678, 686, 324/500, 512, 519; 345/173, 174; 702/1, 702/47, 52
See application file for complete search history.

(56) References Cited

U.S. PATENT DOCUMENTS

| | | | |
|---|---|---|---|
| 4,621,227 A | | 11/1986 | Venema |
| 6,690,183 B2 | | 2/2004 | Braun |
| 7,304,484 B2 | | 12/2007 | Braun et al. |
| 2005/0035772 A1* | | 2/2005 | Bauer ................ G01R 31/2882 324/712 |
| 2010/0244850 A1* | | 9/2010 | Yano ..................... G01R 31/52 324/510 |
| 2015/0130273 A1* | | 5/2015 | Govindaraj ............. B60L 50/10 307/10.1 |

FOREIGN PATENT DOCUMENTS

| | | |
|---|---|---|
| DE | 102006020301 | 11/2006 |
| DE | 102010048677 | 4/2012 |
| EP | 1251357 | 9/2003 |
| EP | 1719990 | 11/2013 |

* cited by examiner

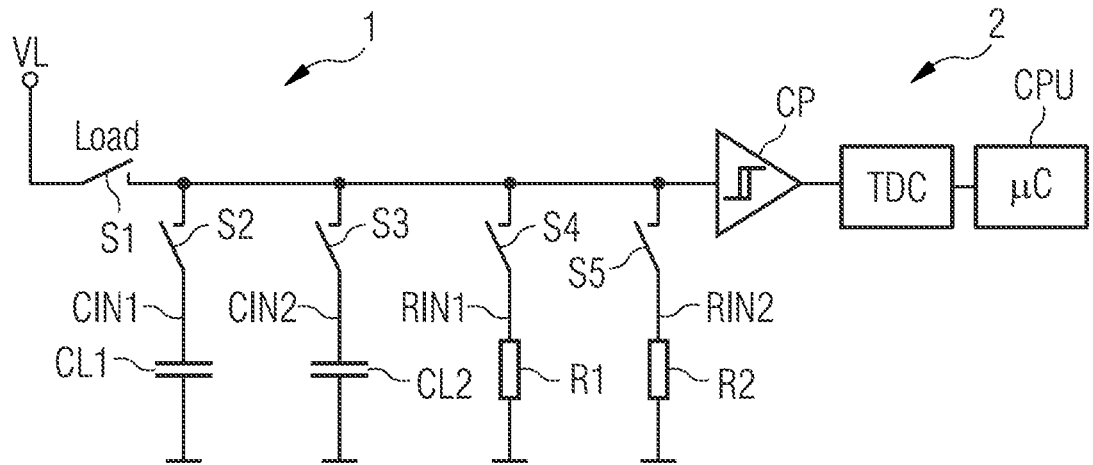
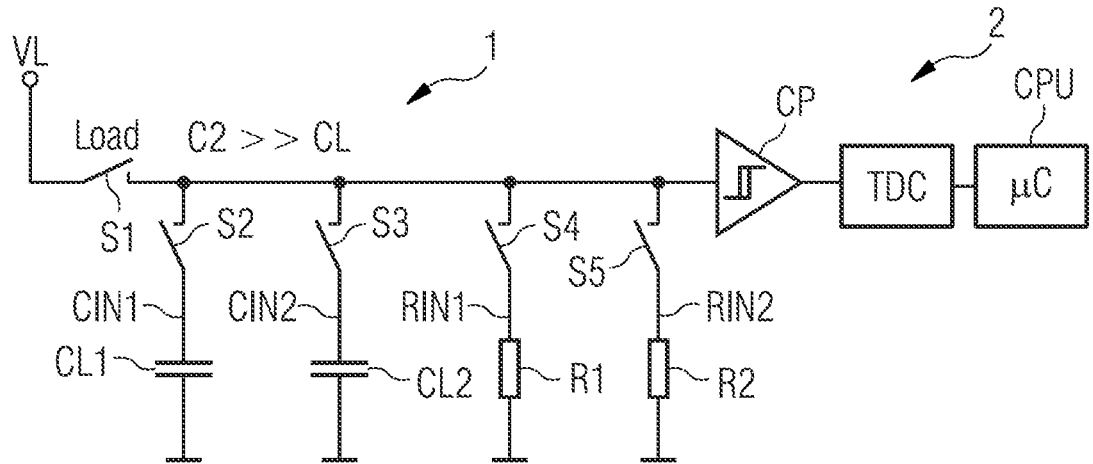

METHOD FOR DETERMINING AN ELECTRICAL PARAMETER AND MEASUREMENT ARRANGEMENT FOR DETERMINING AN ELECTRICAL PARAMETER

CROSS-REFERENCE TO RELATED APPLICATIONS

The present application is the national stage entry of International Patent Application No. PCT/EP2018/068258, filed on Jul. 5, 2018, which claims the benefit of priority of European Patent Application No. 17184021.8, filed on Jul. 31, 2017, all of which are hereby incorporated by reference in their entirety for all purposes.

BACKGROUND OF THE INVENTION

This invention relates to a method for determining an electrical parameter and, further, to a measurement arrangement for determining an electrical parameter. For example, the electrical parameter to be determined is a resistance or a capacitance value or a ratio thereof.

Sensors are used in an ever increasing variety in many fields of technology. In a broad sense, a sensor can be considered an electronic component which is arranged for detecting events or changes in its environment, generate a sensor signal and send the information contained in the sensor signal to other electronics, frequently a microprocessor or computer processor, for data analysis. Dedicated sensors are designed to measure electrical parameters such as resistance and capacitance. Examples include micromechanical sensors, such as strain gauges or capacitive environmental sensors. These sensors can be used to measure force, pressure, temperature, and humidity, for example.

In many applications there is a demand for high precision. For example, measuring strain gauges with high precision can be a challenge. Due to small excitation of the strain gauges on a load cell of only 0.2% (2000 ppm) full scale, and due to a high resolution of 16 Bit and more, resistance often needs to be determined with a precision deeply in the ppb range. Typically, this is done by measuring a ratio of resistances.

FIG. 3 shows a measurement arrangement for determining a ratio of resistances as known in the prior art. The measurement arrangement comprises a measurement path 1 and a data analysis path 2. The measurement path 1 connects a load supply terminal LS to an input side of a comparator CP via a load select switch S1. The load supply terminal LS is connected to a load voltage VL. The load supply terminal is connected to a reference potential, such as ground GND, via a first and second block type capacitors C1, C2, respectively. A load capacitor CL is connected between the load select switch and the input side of the comparator and, further, to the reference potential. In addition, the measurement path 1 comprises two terminals RIN1, RIN2 which are connected between the load select switch S1 and the input side of the comparator CP. The data analysis path 2 comprises the comparator CP, a time-to-digital converter TDC and a control and processing unit CPU connected in series.

Basically, the measuring concept relies on transforming a variation of resistance into a variation of voltage which is determined from a high-precision time interval measurement. For example, a strain gauge SG is connected to the terminals RIN1, RIN2. In this example, the strain gauge SG is represented by a first and a second resistor R1, R2. These SG resistors are connected to the load capacitor CL, forming a low-pass filter. The load capacitor CL is charged with the supply voltage VL and then discharged through one of the resistors R1, R2. The discharge time with respect to a trigger or threshold voltage Vth is measured using a time-to-digital Converter, TDC, and in typical applications lies in the range 100 μs. The TDC may have a single-shot resolution of less than 20 ps.

In this example, the complete measurement sequence consists of the following steps. First, the load capacitor CL is charged with the supply voltage VL. At this point in time the supply voltage has a certain contribution of noise, and, thus, will be denoted a first supply voltage VL1 hereinafter. Then, the load capacitor CL is discharged through the first resistor R1. The comparator CP switches as soon as the voltage drops below the threshold voltage Vth. The time-to-digital converter TDC measures a time interval between initiating discharging until the voltage reaches the threshold voltage Vth. This time interval determines a first discharge time $t_1$.

Now the load capacitor CL is charged again with the supply voltage VL. At this point in time the supply voltage has a certain contribution of noise, and, thus, will be denoted a second supply voltage VL2 hereinafter. In general, the contribution of noise to the supply voltage may vary over time such that VL1 may not be completely equal to VL2. The load capacitor CL is then discharged through the second resistor R2. The comparator CP switches as the voltage drops below the threshold voltage Vth. The time-to-digital converter TDC measures the time interval between initiating discharging until the voltage reaches the threshold voltage Vth. This time interval determines a second discharge time $t_2$.

The discharge times $t_1$ and $t_2$ are determined by the resistances of the first and second resistors, denoted as $R_1$ and $R_2$, the capacitance of the load capacitor, denoted as CL, the first and second supply voltages, denoted as $VL_1$ and $VL_2$, and by the threshold voltage, denoted as $V_{th}$. The discharge times $t_1$ and $t_2$ yield:

$$t_1 = R_1 \cdot CL \cdot \ln\left(\frac{VL_1}{V_{th}}\right)$$

and $$t_2 = R_2 \cdot CL \cdot \ln\left(\frac{VL_2}{V_{th}}\right).$$

The ratio of discharge times can be reformulated to derive an expression for the ratio of resistances:

$$\frac{t_1}{t_2} = \frac{R_1 \cdot CL \cdot \ln\left(\frac{VL_1}{V_{th}}\right)}{R_2 \cdot CL \cdot \ln\left(\frac{VL_2}{V_{th}}\right)} = \frac{R_1 \cdot \ln\left(\frac{VL_1}{V_{th}}\right)}{R_2 \cdot \ln\left(\frac{VL_2}{V_{th}}\right)} \Rightarrow \frac{R_1}{R_2} = \frac{t_1 \cdot \ln\left(\frac{VL_2}{V_{th}}\right)}{t_2 \cdot \ln\left(\frac{VL_1}{V_{th}}\right)}.$$

As can be seen by the calculation result, a difference in $VL_1$ and $VL_2$ introduces noise and inaccuracies to the measurement of the ratio of $R_1/R_2$. Since the charging of the load capacitor CL happens at two different points in time, noise on the supply voltage introduces noise to the measurement by changing the actual start voltage at the beginning of each measurement, i.e. $VL_1$ or $VL_2$ inside the sequence.

The measuring process can be repeated in a time-multiplex fashion in order to reduce the impact of noise. Calculating the ratio of the results will turn out absolute values and temperature dependencies of the capacitor and the comparator. High value capacitors for blocking and other external circuit measures have been used to minimize the voltage ripple and stabilize the power supply. These measures, however, do not eliminate the problem entirely. They only reduce the noise in the measurements by varying degrees.

FIG. 4 shows a measurement arrangement for determining a ratio of capacitances as known in the prior art. The measurement arrangement is similar to the one depicted in FIG. 3 but there is only one resistor R1 connected to the measurement path. Instead of a load capacitor CL there are two capacitors C1 and C2 connected to the measurement path 1 via measurement terminals CIN1, CIN2 representing a measurement object, e.g. a capacitive environmental sensor.

In this example, the complete measurement sequence consists of the following steps. First, the first capacitor C1 is charged with the supply voltage VL1. The capacitor C1 is then discharged through the single resistor R1. The comparator CP switches as soon as the voltage drops below the threshold voltage Vth. Thus giving a discharge time $t_1$. Then, the second capacitor C2 is charged with the supply voltage VL2 and discharged through resistor R1 again. The comparator CP switches when the voltage drops below the threshold Vth, thus giving a discharge time $t_2$.

The discharge times $t_1$ and $t_2$ yield:

$$t_1 = R_1 \cdot C_1 \cdot \ln\left(\frac{VL_1}{V_{th}}\right)$$

and $$t_2 = R_1 \cdot C_2 \cdot \ln\left(\frac{VL_2}{V_{th}}\right).$$

The ratio of discharge times can be reformulated to derive an expression for the ratio of resistances:

$$\frac{t_1}{t_2} = \frac{R_1 \cdot C_1 \cdot \ln\left(\frac{VL_1}{V_{th}}\right)}{R_1 \cdot C_2 \cdot \ln\left(\frac{VL_2}{V_{th}}\right)} = \frac{C_1 \cdot \ln\left(\frac{VL_1}{V_{th}}\right)}{C_2 \cdot \ln\left(\frac{VL_2}{V_{th}}\right)} \Rightarrow \frac{C_1}{C_2} = \frac{t_1 \cdot \ln\left(\frac{VL_2}{V_{th}}\right)}{t_2 \cdot \ln\left(\frac{VL_1}{V_{th}}\right)}.$$

As can be seen by the calculation result, a difference in $VL_1$ and $VL_2$ introduces noise and inaccuracies to the measurement of the ratio of $C_1/C_2$. Since the charging of the load capacitor CL happens at two different points in time, noise on the supply voltage introduces noise to the measurement by changing the actual start voltage at the beginning of each measurement, i.e. $VL_1$ or $VL_2$ inside the sequence.

SUMMARY OF THE INVENTION

It is to be understood that any feature described hereinafter in relation to any one embodiment may be used alone, or in combination with other features described hereinafter, and may also be used in combination with one or more features of any other of the embodiments, or any combination of any other of the embodiments, unless explicitly described as an alternative. Furthermore, equivalents and modifications not described below may also be employed without departing from the scope of the method for determining an electrical parameter and the measurement arrangement for determining an electrical parameter as defined in the accompanying claims.

In at least one embodiment a method for determining an electrical parameter involves the following steps. A first and a second capacitor are charged in parallel from a common supply voltage. Then, the first capacitor is discharged and a first discharge time is determined. Furthermore, a second discharge time is determined. This second discharge time may involve discharging the first capacitor for a second time. Alternatively, or in addition, the second discharge time is determined from discharging the second capacitor. Finally, the electrical parameter is determined from or as a ratio of the first and the second discharge times.

In order to discharge the first capacitor for a second time the first capacitor may be recharged to the level defined by the common supply voltage again or to some other level. However, if sufficient charge remains stored on the first capacitor it may even be possible to discharge from a voltage smaller than the common supply voltage, for example. Discharging of the second capacitor may start from the common supply voltage, for example.

The proposed concept allows for employing a similar or equal starting voltage at the measurement of the first discharge time and at the measurement of the second discharge time. This way the starting voltages may be represented by the common supply voltage and have a similar or same level of noise which tends to cancel out in the ratio calculation of the electrical parameter. Thus, fewer or even no noise is introduced to the measurement by the common supply voltage as power supply. Instead of reducing the noise on the power supply voltage, the effect of the power supply voltage noise on the measurements can be reduced or eliminated completely. As a consequence there may be no more need for external components, e.g. large capacitances, to reduce power supply noise. In fact, a higher power supply noise can be tolerated.

This allows for increased measurement accuracy without increasing the amount of external components.

In at least one embodiment the discharging of the first capacitor comprises further steps. The discharging is started and stopped when the first voltage reaches a threshold voltage. Then, the first discharge time denotes a time between start and stop of discharging the first capacitor. In addition, or alternatively, discharging the second capacitor is started and stopped when the second of voltage reaches the threshold voltage. The second discharge time then denotes a time between start and stop of discharging the second capacitor.

The discharging times can be determined from an analog or digital difference between time instances at which discharging is started and then stopped, e.g. by mean of start and stop signals. Alternatively, the discharge time can be measured directly as a time interval between start and stop instances of discharging rather than as an absolute time difference.

In at least one embodiment the first capacitor and the second capacitor are charged simultaneously. Alternatively, or in addition, the parallel charging of the first and the second capacitor starts at a same instant in time, e.g. are synchronized to each other.

In at least one embodiment the first capacitor has a first capacitance value. The second capacitor has a second capacitance value. The capacitance values may be close in value to each other, e.g. the capacitance values are the same with process parameters or may differ only by values smaller than 10% or smaller than 1%. The first and second capacitance value can be proportional in value to each other. In some embodiments the first and second capacitance value can be matched or even be same in value.

In at least one embodiment the first and/or second capacitor is discharged through at least one resistor. For example, discharging may proceed via the same resistor for both the first and the second discharge times. However, discharging the first capacitor may proceed via a dedicated first resistor while discharging the second capacitor may proceed via a dedicated second resistor. It may further be possible to use more than two resistors and/or more than two capacitors. However, in case more than two capacitors are implemented, they all may be charged in parallel with the common supply voltage as a first step as well.

In at least one embodiment the first and the second capacitor are charged in parallel from the common supply voltage for a second time, i.e. after discharging the first and the second capacitor and determining the first and second discharge time. Then, a third discharge time is determined by discharging the first capacitor. Furthermore, a fourth discharge time is determined by discharging the first capacitor again or by discharging of the second capacitor. Finally, the electrical parameter is determined from or as a ratio of the first, second, third and fourth discharge times.

Some applications may benefit from changing the order of discharge to eliminate any systematic effects but this is not mandatory. For example, the third discharge time can also be determined by discharging the second capacitor and the fourth discharge time can be determined by discharging the second capacitor etc.

In at least one embodiment the first and second discharge times are determined from discharging the first and the second capacitor by means of a first resistor. The third and fourth discharge times are determined from discharging the first and the second capacitor by means of a second resistor. The third and fourth discharge times are determined may be determined after recharging the capacitors.

In at least one embodiment the first capacitor is charged with the common supply voltage using the second capacitor. The capacitor is charged before the first capacitor is discharged for a second time. For example, the second capacitor is used to recharge the first capacitor with the common supply voltage. Then the first capacitor can be discharged to yield the second (or further) discharge time.

In at least one embodiment further capacitors are charged from the common supply voltage in parallel with the first and the second capacitors. Further discharge times are determined by discharging the further capacitors, respectively. Further electrical parameters are then determined from ratios of the first, the second and the further discharge times, respectively. The same concepts described herein with respect to the first and the second capacitor may be applied also to the further capacitors. In fact, the electrical parameter to be determined may be formulated as a function of several capacitance and/or resistance values.

In at least one embodiment at least one electrical parameter to be determined is a resistance ratio and/or a capacitance ratio. For example, the resistance ratio and/or a capacitance ratio is indicative of a measurement object such as a sensor which may be connected to a measurement arrangement, e.g. by means of terminals and switches, wherein the measurement arrangement implements the method for determining the electrical parameter as disclosed herein.

In at least one embodiment a measurement arrangement for determining an electrical parameter comprises a measurement path and a data analysis path. The measurement path is arranged to be connected to a first and a second capacitor, respectively. The measurement path is further arranged to provide a common supply voltage. The data analysis path is connected to the measurement path and configured to determine the electrical parameter according to the method for determining the electrical parameter as discussed above.

In at least one embodiment the measurement path further comprises a load supply terminal which can be connected to the common supply voltage. A first and a second selectable terminal are provided to connect the first and the second capacitor, respectively. A selectable measurement terminal may be considered a terminal that can be selected to establish an electrically active connection to the measurement path. Examples of selectable terminals include switches or transistors. Furthermore, the terminals may be connected to the data analysis path by means of control lines in order to be controllable by means of the data analysis path or components thereof.

The data analysis path further comprises a comparator, a time-to-digital converter and a control and processing unit, which are connected in series. For example, the comparator is arranged to provide a trigger signal when a voltage applied at an input side reaches a threshold voltage. The comparator is connected to the measurement path. Furthermore, the time-to-digital converter is arranged to provide a timing signal depending on the trigger signal.

Finally, the control and processing unit is arranged to select the first and the second selectable terminal in order to charge, in parallel, the first and the second capacitor from the common supply voltage provided at the load supply terminal. Furthermore, the control and processing unit is also arranged to select the first and the second selectable terminal to discharge the first and/or the second capacitor, respectively.

In at least one embodiment a strain gauge comprises the at least one resistor and is connected to at least one further selectable terminal. For example, the electrical parameter relates to a resistance or ratio of resistances characteristic to a force applied on the strain gauge.

In at least one embodiment a capacitive sensor is connected to at least one of the first or the second selectable terminals. The sensor comprises at least one of the first or the second capacitor. For example, the electrical parameter relates to a capacitance or ratio of capacitances characteristic to a state of the capacitive sensor. Examples of capacitive sensors include capacitive environmental sensors arranged to measure force, pressure, temperature, and humidity, for example.

In at least one embodiment the measurement arrangement comprises an integrated circuit. The first and second capacitor and/or the at least one resistor or integrated into the same integrated circuit or, alternatively, are connected to the selectable terminals as external components, respectively.

Further embodiments of the method are readily derived from the various implementations and embodiments of the circuit arrangement and vice versa.

In the following, the concept presented above is described in further detail with respect to drawings, in which exemplary embodiments are presented.

In the exemplary embodiments and Figures below, similar or identical elements may each be provided with the same reference numerals. The elements illustrated in the drawings and their size relationships among one another, however, should not be regarded as true to scale. Rather individual elements, such as layers, components, and regions, may be exaggerated to enable better illustration or improved understanding.

BRIEF DESCRIPTION OF THE DRAWINGS

FIG. 1 shows a measurement arrangement for determining a resistance ratio,

FIG. 2 shows another measurement arrangement for determining a resistance ratio.

DETAILED DESCRIPTION

Figure 3:
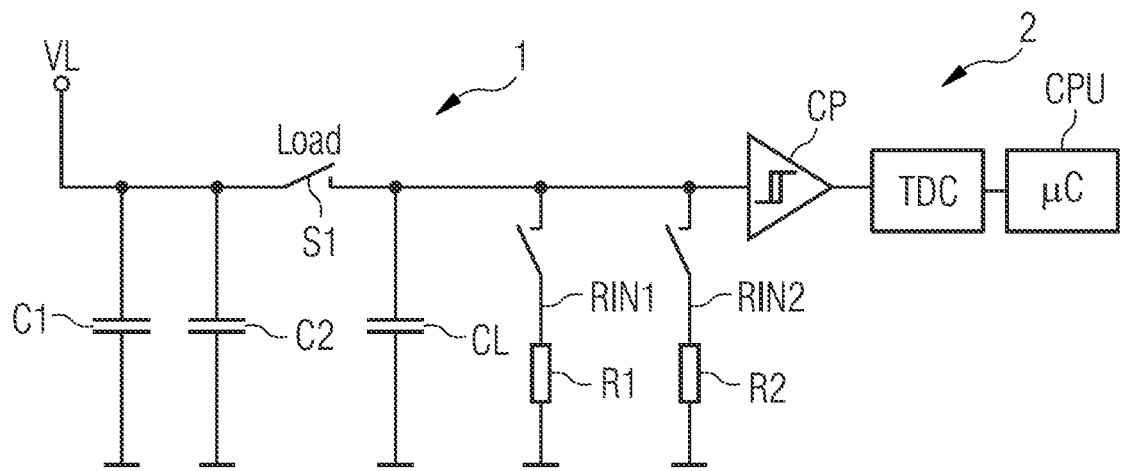
FIG. 3 shows a measurement arrangement for determining a ratio of resistances as known from the prior art.
Figure 4:
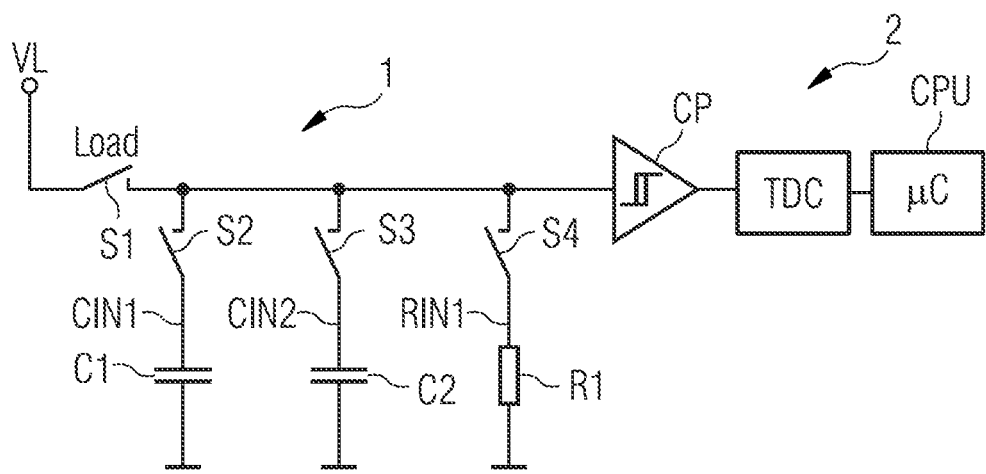
FIG. 4 shows a measurement arrangement for determining a ratio of capacitances as known from the prior art.

FIG. 1 shows a method and measurement arrangement for determining a resistance ratio. The measurement arrangement comprises a measurement path 1 and a data analysis path 2. The measurement arrangement can be implemented as an integrated circuit with the measurement path 1 and the data analysis path 2 integrated into the same integrated circuit, e.g. a common die or package. However, it is also possible to only have some functional units integrated, e.g. resistors and/or capacitors can be externally connected to dedicate input terminals. For example, the measurement arrangement comprises selectable input terminals to connect a strain gauge SG or a capacitive sensor to be measured.

The measurement path 1 connects a load supply terminal LS to an input side of a comparator CP via a load select switch S1. The load supply terminal LS is connected to a supply voltage VL. Furthermore, the measurement path 1 comprises a series of selectable input terminals CIN1, CIN2, RIN1, RIN2 implemented with switches S2, S3, S4, and S5, respectively, to individually switch or activate input via the terminals, respectively.

A grounded first and second capacitor CL1, CL2 are connected to a first and a second input terminal CIN1, CIN2, respectively. The capacitors CL1, CL2 have known capacitance values. For example, the capacitors are high precision ceramic capacitors such as C0G capacitors with zero drift.

Furthermore, a first and a second resistor R1, R2 are connected to a third and a fourth input terminal RIN1, RIN2, respectively. In fact, the first and second capacitor CL1, CL2 and the first and second resistor R1, R2 are connected in parallel to each other. In this exemplary embodiment the first and second resistor R1, R2 represent a strain gauge SG whose resistance values are to be measured in order to derive a force acting on the strain gauge, for example.

The data analysis path 2 comprises the comparator CP, a time-to-digital converter TDC and a control and processing unit CPU connected in series. An input side of the comparator CP is connected to a threshold voltage Vth. Another input is connected to the measurement path 1.

The time-to-digital converter TDC is connected to an output of the comparator, and, further, to connected to the control and processing unit CPU. The time-to-digital converter TDC is adapted to recognize events, such as a start and a stop of discharging a capacitor, and to provide a digital output signal which is a representation of the respective instances in time. For example, the time-to-digital converter TDC might output a start signal indicating the start of discharging a capacitor. A stop signal might be output indicating the stop of discharging a capacitor. A discharge time could then be derived from a digital difference of the start and stop signals. Alternatively, the discharge time can be measured directly as a time interval between start and stop instances of discharging rather than as an absolute time difference. In either case the output of the time-to-digital converter TDC typically constitutes a digital (binary) output. In some embodiments the time-to-digital converter TDC comprises a ring oscillator built from an odd number of digital inverters, for example.

The control and processing unit CPU is connected to the selectable terminals via control lines in order to control the switches S1 to S5. Switching sequences and operation of the measurement path 1 and the data analysis path 2 is controlled by the control and processing unit CPU. The control and processing unit CPU comprises one or more microcontrollers, processors, an application-specific integrated circuit, ASIC, or the like. For example, a method for determining an electrical parameter such as a resistance or capacitance can be executed by the control and processing unit CPU. The method may be implemented as software in the microcontroller or by hardware such as dedicated control logic components.

The measuring arrangement can be used to implement a method for determining an electrical parameter. For example, various measurement or switching sequences can be implemented in order to determine a resistance or capacitance value or a ratio thereof.

A first measurement sequence can be used to determine a ratio of resistance values. The first measurement sequence involves the following procedural steps.

In step s1-1, the first capacitor CL1 and the second capacitor CL2 are charged in parallel with the common supply voltage VL. Switches S1, S2, and S3 are closed while switches S4 and S5 remain open. In this embodiment the capacitors CL1 and CL2 are of the same type, e.g. are matched such that they have the same capacitance value (within process parameters and tolerances). Charging of the first and second capacitors CL1, CL2 may start at the same time. As a consequence a first voltage VL1 stored after charging on the first capacitor CL1 is the same in value than a second voltage VL2 stored after charging on the second capacitor CL2.

In step s1-2, the first capacitor CL1 is discharged through the first resistor R1. Switches S1 and S3 are open while switch S2 remains closed. Discharging the first capacitor CL1 by means of the first resistor R1 is started by closing switch S4 while S5 remains open. At the same time, the time-to-digital converter TDC is triggered to start a measurement of a first discharge time t11. The start can be triggered by the control and processing unit CPU or by detecting the voltage VL1 stored on the first capacitor CL1 to drop, e.g. measured by means of the comparator CP.

In step s1-3, the comparator CP switches when the voltage VL1 drops below a threshold voltage Vth. This can be indicated by a trigger signal Sout which is provided by the comparator CP when the voltage applied at its input side reaches the threshold voltage Vth. The trigger signal Sout defines a stop of discharging the first capacitor CL1 and can be provided to the time-to-digital converter TDC in order to stop the measurement of the discharge time. In some embodiments the trigger signal Sout can be provided to the control and processing unit CPU which, in turn, issues a stop signal to time-to-digital converter TDC to stop the measurement of the discharge time. In either case, a characteristic first discharge time t11 is determined. The first discharge time t11 denotes a time difference between start and stop of discharging the first capacitor, e.g. it denotes a characteristic time for the capacitor to drop from the common supply voltage to the threshold voltage Vth, when discharged via the first resistor R1.

In step s1-4, the second capacitor CL2 is discharged. Switch S1 remains open, i.e. the second capacitor remains at the previously charged common supply voltage VL. Switch S3 is closed. Furthermore, switches S2 and S4 remain open. Discharging the second capacitor CL2 by means of the second resistor R2 is started by opening switch S5 while S4 remains closed. At the same time, the time-to-digital converter TDC is triggered to start a measurement of a second discharge time t12. The start can be triggered by the control and processing unit CPU or by detecting the voltage stored on the capacitor to drop, e.g. by means of the comparator CP as in step s1-2.

In step s1-5, the comparator CP switches when the voltage VL2 on the second capacitor CL2 drops below the threshold voltage Vth. This step is essentially the same as step s1-3, but with the first and second capacitors interchanged. The comparator CP switches when the voltage drops VL2 below the threshold voltage Vth, thus giving the second discharge time t12.

In step s1-6, the first capacitor CL1 and the second capacitor CL2 are charged in parallel with the common supply voltage VL again. Switches S1, S2, and S3 are open while switches S4 and S5 remain closed.

In step s1-7, the first capacitor CL1 is discharged through the second resistor R2. Switches S1 and S3 are open while switch S2 is closed. Discharging the first capacitor CL1 by means of the second resistor R2 is started by closing switch S5 while S4 remains open. At the same time, the time-to-digital converter TDC is triggered to start a measurement of a third discharge time t21. The start can be triggered by the control and processing unit CPU or by detecting the voltage VL1 stored on the first capacitor CL1 to drop, e.g. measured by means of the comparator CP.

In step s1-8, the comparator CP switches when the voltage VL1 on the first capacitor CL1 drops below the threshold voltage Vth. This step is essentially the same as step s1-3. The comparator CP switches when the voltage drops VL1 below the threshold voltage Vth, thus giving the third discharge time t21.

In step s1-9, the second capacitor CL2 is then discharged through the first resistor R1. Switch S1 remains open, i.e. the second capacitor remains at the common supply voltage VL. Switch S3 is closed. Furthermore, switches S2 and S5 remain open. Discharging the second capacitor CL2 by means of the second resistor R2 is started by opening switch S4.

Finally, in step s1-10, the comparator CP switches when the voltage VL2 on the second capacitor CL2 drops below the threshold voltage Vth, thus giving a fourth discharge time t22. This step is essentially the same as step s1-3, but with the first and second capacitors interchanged. The comparator CP switches when the voltage drops VL2 below the threshold voltage Vth, thus giving the fourth discharge time t22.

The control and processing unit CPU receives the measured discharge times which are related to the corresponding resistance and capacitance values:

$$t_{11} = R_1 \cdot CL_1 \cdot \ln\left(\frac{VL_1}{V_{th}}\right),$$

$$t_{12} = R_1 \cdot CL_2 \cdot \ln\left(\frac{VL_2}{V_{th}}\right),$$

$$t_{21} = R_2 \cdot CL_1 \cdot \ln\left(\frac{VL_1}{V_{th}}\right),$$

$$t_{22} = R_2 \cdot CL_2 \cdot \ln\left(\frac{VL_2}{V_{th}}\right),$$

thus $$\frac{t_{11} \cdot t_{12}}{t_{21} \cdot t_{22}} = \frac{R_1 \cdot CL_1 \cdot \ln\left(\frac{VL_1}{V_{th}}\right) \cdot R_1 \cdot CL_2 \cdot \ln\left(\frac{VL_2}{V_{th}}\right)}{R_2 \cdot CL_1 \cdot \ln\left(\frac{VL_1}{V_{th}}\right) \cdot R_2 \cdot CL_2 \cdot \ln\left(\frac{VL_2}{V_{th}}\right)}.$$

Following the procedural steps discussed above the measurement arrangement is prepared with a starting voltage VL1 at the measurement of the discharge time t11 equal to a starting voltage VL1 at the measurement of the discharge time t21, and a starting voltage VL2 at the measurement of the discharge time t12 equal to a starting voltage VL2 at the measurement of the discharge time t22. This is due to charging of the first and second capacitors CL1 and CL2 in parallel, e.g. at the same time. Therefore, the voltage level for both capacitors essentially is identical. Thus, the last equation above can be simplified and yields $$\frac{t_{11} \cdot t_{12}}{t_{21} \cdot t_{22}} = \frac{R_1^2}{R_2^2} \text{ or } \frac{R_1}{R_2} = \sqrt{\frac{t_{11} \cdot t_{12}}{t_{21} \cdot t_{22}}}.$$

As can be seen by the calculated result, the ratio R1/R2 depends on the results of the time measurement only. Noise on the common supply voltage does not factor into the result at all as it tends to cancel out.

The proposed approach to the measurement sequence employs two matched capacitances that are charged simultaneously from the same supply voltage. The complete measurement sequence can be summarized as follows:
1) The capacitors CL1 and CL2 are charged with the supply voltage VL1
2) The capacitor CL1 is then discharged through R1
3) The comparator CP switches as soon as the voltage drops below a threshold Vth, thus giving a discharge time t11
4) The capacitor CL2 is then discharged through R2
5) The comparator CP switches as soon as the voltage drops below the threshold Vth. Thus giving a discharge time t22
6) The capacitors CL1 and CL2 are charged with the supply Voltage VL2 again
7) The capacitor CL1 is then discharged through R2
8) The comparator CP switches as soon as the voltage drops below a threshold Vth, thus giving a discharge time t21
9) The capacitor CL2 is then discharged through R1
10) The comparator CP switches as soon as the voltage drops below the threshold Vth, thus giving a discharge time t21.

FIG. 2 shows another measurement arrangement for determining a resistance ratio. The measurement arrangement essentially is the same as the one presented above (see FIG. 1). In high end applications it may be required to use two high precision capacitances as first and second capacitors CL1, CL2 (ceramic capacitances with low drift such as C0G, for example). Alternatively, however, it is possible to replace one of the high precision capacitors with a less expensive capacitor that has much bigger capacitance than the other capacitor. This capacitor (denoted second capacitor CL2 hereinafter) can be used to recharge the first capacitor CL1 before the second measurement.

In steps 2-1, 2-2, and 2-3 correspond to steps 1-1, 1-2, and 1-3, respectively. However, in step 2-4, the first capacitor CL1 is charged again with the common supply voltage VL. As a consequence a voltage VL1 stored after charging on the first capacitor CL1 for the first time is the same in value than a voltage VL1' stored after charging the first capacitor CL1 by means of the second capacitor CL2. In step 2-4 switches S1, S4 and S5 are open and only switches S2 and S3 are closed.

In step 2-5, the first capacitor CL1 is discharged by means of the second resistor R2, as opposed to being discharged by means of the first resistor R1 in step s2-2. Switches S1, S3 and S4 are open, switches S2 and S5 are closed. In step 2-6, the comparator CP switches when the voltage VL2 on the first capacitor CL1 drops below the threshold voltage Vth.

In step 2-7 both capacitors are charged with the common supply VL again. Further steps s2-8 to s2-12 are essentially the same as steps s2-2 to 2-6, but with the first and second resistors R1, R2 interchanged. As a consequence a voltage VL2 stored after charging on the first capacitor CL1 for the third time is the same in value than a voltage VL2' stored after charging the first capacitor CL1 by means of the second capacitor CL2. The procedure according to steps 2-1 to 2-12 results in a set of four discharge times t11, t12, t21 and t22.

The control and processing unit CPU receives the measured discharge times which are related to the corresponding resistance and capacitance values:

$$t_{11} = R_1 \cdot CL_1 \cdot \ln\left(\frac{VL_1}{V_{th}}\right),$$

$$t_{12} = R_2 \cdot CL_1 \cdot \ln\left(\frac{VL_2}{V_{th}}\right),$$

$$t_{21} = R_1 \cdot CL_1 \cdot \ln\left(\frac{VL_2'}{V_{th}}\right),$$

$$t_{22} = R_2 \cdot CL_1 \cdot \ln\left(\frac{VL_1'}{V_{th}}\right).$$

thus $$\frac{t_{11} \cdot t_{12}}{t_{21} \cdot t_{22}} =$$

$$\frac{R_1 \cdot CL_1 \cdot \ln\left(\frac{VL_1}{V_{th}}\right) \cdot R_1 \cdot CL_1 \cdot \ln\left(\frac{VL_2'}{V_{th}}\right)}{R_2 \cdot CL_1 \cdot \ln\left(\frac{VL_2}{V_{th}}\right) \cdot R_2 \cdot CL_1 \cdot \ln\left(\frac{VL_1'}{V_{th}}\right)} = \frac{R_1^2 \cdot \ln\left(\frac{VL_1}{V_{th}}\right) \cdot \ln\left(\frac{VL_2'}{V_{th}}\right)}{R_2^2 \cdot \ln\left(\frac{VL_2}{V_{th}}\right) \cdot \ln\left(\frac{VL_1'}{V_{th}}\right)}.$$

Following the procedural steps discussed above the measurement arrangement is prepared with a starting voltage VL1 at the measurement of the discharge time t11 and a starting voltage VL1' at the measurement of the discharge time t22, and a starting voltage VL2 at the measurement of the discharge time t12 and a starting voltage VL2' at the measurement of the discharge time t21. The higher the capacitance of the second capacitor CL2 in comparison to the first capacitor CL1 the more accurate the result will be. The size of the second capacitor CL2 can be much smaller and cheaper than a COG capacitance, for example. Furthermore, the capacitance of the second capacitor CL2 can be significantly smaller than a block capacitance to reduce noise on the power supply voltage. Increased measurement accuracy can be achieved without increasing the amount of external components.

In summary, the measurement sequence involves the following steps:

1) The capacitors CL1 and CL2 are charged with the supply Voltage VL1
2) The capacitor CL1 is then discharged through R1
3) The comparator switches when the voltage drops below a threshold Vth. Thus giving a discharge time t11.
4) The capacitor CL1 is then charged by CL2 to VL1' again.
5) The capacitor CL1 is then discharged through R2
6) The comparator switches when the voltage drops below a threshold Vth. Thus giving a discharge time t22.
7) The capacitors CL1 and CL2 are charged with the supply Voltage VL2 again
8) The capacitor CL1 is then discharged through R2
9) The comparator switches when the voltage drops below a threshold Vth. Thus giving a discharge time t12.
10) The capacitor CL1 is then charged by CL2 to VL2' again.
11) The capacitor CL1 is then discharged through R1
12) The comparator switches when the voltage drops below a threshold Vth. Thus giving a discharge time t21.

The measurement arrangement of FIG. 1 can be modified to have only a single resistor R1 connected to the measurement path 1. The two capacitors C1 and C2 are connected to the measurement path, e.g. as part of a measurement object, e.g. a capacitive environmental sensor.

Steps s3-1 to s3-5 are similar to steps s1-1 to s1-5, respectively, discussed above. In step s3-1, the first capacitor CL1 and the second capacitor CL2 are charged in parallel with the common supply voltage VL. Switches S1, S2, and S3 are closed while switch S4 remains open. As a consequence a first voltage VL1 stored after charging on the first capacitor CL1 is the same in value than a second voltage VL1' stored after charging on the second capacitor CL2.

In step s1-2, the first capacitor CL1 is discharged through the first resistor R1. Switches S1 and S3 are open while switch S2 remains closed. Discharging the first capacitor CL1 by means of the first resistor R1 is started by closing switch S4. The time-to-digital converter TDC measures a first discharge time t1.

In step s3-3, the comparator CP switches when the voltage VL1 drops below a threshold voltage Vth. In step s3-4, the second capacitor CL2 is discharged. Switch S1 remains open, i.e. the second capacitor is at the common supply voltage VL. Switches S3 and S4 are closed while switch S2 remains open. The time-to-digital converter TDC measures a second discharge time t2. In step s1-5, the comparator CP switches when the voltage VL1' on the second capacitor CL2 drops below the threshold voltage Vth. The comparator CP switches when the voltage VL1' drops below the threshold voltage Vth, thus giving the second discharge time t2.

In order to counter the effects of self-discharge of the capacitive sensors, which are typically the capacitance to be determined in these applications, the measurement sequence can (optionally) be repeated in reverse order.

The control and processing unit CPU receives the measured discharge times which are related to the corresponding resistance and capacitance values:

$$t_{11} = R_1 \cdot CL_1 \cdot \ln\left(\frac{VL_1}{V_{th}}\right),$$

$$t_1' = R_1 \cdot CL_1 \cdot \ln\left(\frac{VL_2'}{V_{th}}\right),$$

-continued $$t_2 = R_1 \cdot CL_2 \cdot \ln\left(\frac{VL_1'}{V_{th}}\right),$$

$$t_2' = R_1 \cdot CL_2 \cdot \ln\left(\frac{VL_2}{V_{th}}\right),$$

thus $$\frac{t_1 \cdot t_1'}{t_2 \cdot t_2'} = \frac{R_1 \cdot CL_1 \cdot \ln\left(\frac{VL_1}{V_{th}}\right) \cdot R_1 \cdot CL_1 \cdot \ln\left(\frac{VL_2'}{V_{th}}\right)}{R_1 \cdot CL_2 \cdot \ln\left(\frac{VL_1'}{V_{th}}\right) \cdot R_1 \cdot CL_2 \cdot \ln\left(\frac{VL_2}{V_{th}}\right)} = \frac{CL_1^2 \cdot \ln\left(\frac{VL_1}{V_{th}}\right) \cdot \ln\left(\frac{VL_2'}{V_{th}}\right)}{CL_2^2 \cdot \ln\left(\frac{VL_1'}{V_{th}}\right) \cdot \ln\left(\frac{VL_2}{V_{th}}\right)}.$$

In summary, the measurement sequence involves the following steps:
1) The capacitors C1 and C2 are charged with the supply Voltage VL1
2) The capacitor C1 is then discharged through R1
3) The comparator switches when the voltage drops below a threshold Vth. Thus giving a discharge time t1.
4) The capacitor C2 is then discharged through R1 starting from VL1'
5) The comparator switches when the voltage drops below a threshold Vth. Thus giving a discharge time t2.
6) The capacitors C1 and C2 are charged with the supply Voltage VL2
7) The capacitor C2 is then discharged through R1
8) The comparator switches when the voltage drops below a threshold Vth. Thus giving a discharge time t2'.
9) The capacitor C1 is then discharged through R1 starting from VL2'
10) The comparator switches when the voltage drops below a threshold Vth. Thus giving a discharge time t1'.

The invention claimed is:

1. A method for determining an electrical parameter, the method comprising:
charging, in parallel, a first capacitor and a second capacitor from a common supply voltage;
measuring a first discharge time by discharging the first capacitor using a comparator and a time-to-digital converter that is connected to an output of the comparator and that provides a digital output signal;
measuring a second discharge time by discharging the first capacitor a second time or by discharging the second capacitor using the comparator and the time-to-digital converter; and
determining the electrical parameter from a ratio of the first and second discharge times.

2. The method according to claim 1,
wherein discharging the first capacitor further comprises starting discharging and stopping discharging when a first voltage reaches a threshold voltage,
wherein the first discharge time denotes a time between start and stop of discharging the first capacitor, and/or
wherein discharging the second capacitor further comprises starting discharging and stopping discharging the second capacitor when a second voltage reaches the threshold voltage,
wherein the second discharge time denotes a time between start and stop of discharging the second capacitor.

3. The method according to claim 1, wherein the first capacitor and the second capacitor are charged simultaneously and/or parallel charging of the first capacitor and the second capacitor starts at a same instant in time.

4. The method according to claim 1, wherein the first capacitor has a first capacitance value and the second capacitor has a second capacitance value, and wherein the first capacitance value and the second capacitance value are close to each other.

5. The method according to claim 1, wherein the first capacitor and/or the second capacitor is discharged through at least one resistor.

6. The method according to claim 1,
wherein, after discharging the first and second capacitors and determining the first and second discharge times, the first and second capacitors are charged in parallel from the common supply voltage a second time,
wherein a third discharge time is determined by discharging the first capacitor,
wherein a fourth discharge time is determined by discharging the first capacitor or by discharging the second capacitor, and
wherein the electrical parameter is determined from a ratio of the first, second, third and fourth discharge times.

7. The method according to claim 6, wherein the first and second discharge times are measured from discharging the first and second capacitors by a first resistor, and wherein the third and fourth discharge times are measured from discharging the first and second capacitors by a second resistor.

8. The method according to claim 1, wherein the first capacitor is charged with the common supply voltage using the second capacitor before discharging the first capacitor a second time.

9. The method according to claim 1,
wherein further capacitors are charged from the common supply voltage in parallel with the first and second capacitors,
wherein further discharge times are determined by discharging the further capacitors, respectively, and
wherein further electrical parameters are determined from ratios of the first, second and further discharge times, respectively.

10. The method according to claim 1, wherein at least one electrical parameter to be determined is a resistance ratio and/or a capacitance ratio.

11. A measurement arrangement for measuring the electrical parameter, the measurement arrangement comprising:
a measurement path configured to be connected to the first capacitor and the second capacitor, respectively, and configured to provide the common supply voltage; and
a data analysis path connected to the measurement path and configured to determine the electrical parameter according to claim 1.

12. The measurement arrangement according to claim 11,
wherein the measurement path comprises:
a load supply terminal to be connected to the common supply voltage,
a first selectable terminal and a second selectable terminal to connect the first and second capacitors, respectively, and
wherein the data analysis path comprises the comparator, the time-to digital converter and a control and processing unit connected in series,
wherein the comparator is configured to provide a trigger signal when a voltage applied at an input side, connected to the measurement path, reaches a threshold voltage,
wherein the time-to-digital converter is configured to provide a timing signal depending on the trigger signal, and wherein the control and processing unit is configured to select the first and second selectable terminals to charge, in parallel, the first and second capacitors from the common supply voltage and further configured to select the first and second selectable terminals to discharge the first capacitor and/or the second capacitor, respectively.

13. The measurement arrangement according to claim 12, further comprising a strain gauge comprising at least one resistor connected to at least one further selectable terminal.

14. The measurement arrangement according to claim 12, further comprising a capacitive sensor connected to at least one of the first selectable terminal or the second selectable terminal and comprises at least one of the first capacitor or the second capacitor.

15. The measurement arrangement according to claim 14, further comprising an integrated circuit, wherein the first capacitor, the second capacitor and/or at least one resistor are integrated into the same integrated circuit, or are connected to the first and second selectable terminals as external components, respectively.

16. The method according to claim 4, wherein the first and second capacitance values are the same or differ only by values smaller than 10%.

17. The method according to claim 4, wherein the first and second capacitance values are the same or differ only by values smaller than 1%.

18. The method according to claim 4, wherein the first and second capacitance values differ such that the first and second capacitance values are proportional in value to each other.

19. A method for determining an electrical parameter, the method comprising:
 charging, in parallel, a first capacitor and a second capacitor from a common supply voltage;
 measuring a first discharge time by discharging the first capacitor;
 measuring a second discharge time by discharging the first capacitor a second time or by discharging the second capacitor; and
 determining the electrical parameter from a ratio of the first and second discharge times,
 wherein, after discharging the first and second capacitors and determining the first and second discharge times, the first and second capacitors are charged in parallel from the common supply voltage a second time,
 wherein a third discharge time is determined by discharging the first capacitor,
 wherein a fourth discharge time is determined by discharging the first capacitor or by discharging the second capacitor,
 wherein the electrical parameter is determined from a ratio of the first, second, third and fourth discharge times,
 wherein the first and second discharge times are measured from discharging the first and second capacitors by a first resistor, and
 wherein the third and fourth discharge times are measured from discharging the first and second capacitors by a second resistor.

20. A method for determining an electrical parameter, the method comprising:
 performing a measurement sequence comprising:
 charging, in parallel, a first capacitor and a second capacitor from a common supply voltage;
 in a first step, measuring a first discharge time by discharging the first capacitor;
 in a second step, measuring a second discharge time by discharging the first capacitor a second time or by discharging the second capacitor; and
 determining the electrical parameter from a ratio of the first and the second discharge times.

* * * * *